United States Patent [19]

Cunningham et al.

[11] Patent Number: 4,772,934
[45] Date of Patent: Sep. 20, 1988

[54] DELTA-DOPED OHMIC METAL TO SEMICONDUCTOR CONTACTS

[75] Inventors: John E. Cunningham, Eatontown; Erdmann F. Schubert, Hazlet; Won-Tien Tsang, Holmdel, all of N.J.

[73] Assignee: American Telephone and Telegraph Company, AT&T Bell Laboratories, Murray Hill, N.J.

[21] Appl. No.: 871,248

[22] Filed: Jun. 6, 1986

[51] Int. Cl.$^4$ .............................. H01L 23/48
[52] U.S. Cl. ...................... 357/65; 357/71; 357/4; 357/16; 357/63
[58] Field of Search ............ 357/65, 71, 63, 64, 357/22, 4 SL, 52, 4, 16

[56] References Cited

U.S. PATENT DOCUMENTS

| | | | |
|---|---|---|---|
| 4,205,329 | 5/1980 | Dingle et al. | 357/4 SL X |
| 4,261,771 | 4/1981 | Dingle et al. | 357/16 X |
| 4,583,110 | 4/1986 | Jackson et al. | 357/65 |

OTHER PUBLICATIONS

Schubert et al, "The Delta-Doped Field Effect Transistor," *Japanese Jnl, App, Phys.*, vol. 24, No. 8, Aug. 1985, pp. L608–L610.
Schubert et al, "Radiative Electron-Hole Recombination in a New Sawtooth Semiconductor Superlattice Grown by Molecular-Beam Epitaxy, *Phys, Rev. B*, vol. 32, No. 2, 7/15/85, pp. 1085–1089.
Wood et al, "Complex Free-Carrier Profile Synthesis by 'Atomic Plane' Doping of MBE GaAs" *J. Journal App. Phys.*, 51, Jan. 1980, pp. 383–387.
Döhler, "Solid-State Superlattices," *Scientific American*, Nov. 1983, pp. 146–151.
Abstreiter, "Quantization of Photoexcited Electrons in GaAs NIPI Crystals, " *Surface Science,* 113 (1982), 479–480.
"Ohmic Contacts for GaAs Devices", *Solid State Electronics,* vol. 10, pp. 1213–1218, R. H. Cox et al., Pergamon Press 1967.
"In situ Ohmic-contact formation to n- and p- GaAs by molecular beam epitaxy", *App. Phys. Let.*, 33, 12/15/78, W. T. Tsang, pp. 1022–1025.
"Nonalloyed and in situ Ohmic contacts to highly doped n-type GaAs layers grown by molecular beam epitaxy (MBE) for field-effect transistors", J. App. Phy. 50,2/79, J. V. DiLorenzo et al, pp. 951–954.
"Complex Free-Carrier Profile Synthesis by Atomic-Plane doping of MBE GaAs", *J.App.Phy.51, Jan. 1980,* C.E.C. Wood, et al., pp. 383–387.
"Low-Resistance Nonalloyed Ohmic Contacts to Si-Doped Molecular Beam Epitaxial GaAs", *App.Phy.-Let.47,* 7/1/85, P. D. Kirchner, et al, pp. 26–28.
Radiative Electron-Hole Recombination in a New Sawtooth Semiconductor Superlattice Grown by Molecular-Beam Epitaxy", *Phys.Rev.B*, vol. 32, No. 2, 7/15/85, E. F. Schubert, et al., pp. 1085–1089.
The Delta-Doped Field-Effect Transistor", *Japanese Jnl. App. Phys.*, vol. 24, No. 8, Aug. 1985, E. F. Schubert, et al., pp. L608–L610.

*Primary Examiner*—Andrew J. James
*Assistant Examiner*—William A. Mintel
*Attorney, Agent, or Firm*—Daniel D. Dubosky; Oleg E. Alber

[57] ABSTRACT

A non-alloyed ohmic contact in gallium arsenide is described wherein a plurality of delta-doped monolayers are placed at a predetermined distance from each other and from the metal to semiconductor interface of the contact. The predetermined distance is chosen to keep the tunneling barrier extremely thin. In the embodiment shown, silicon is used as a dopant in the gallium arsenide material but other elements from groups II, IV and VI of the periodic table of elements may be used in other III-V semiconductor substrates.

6 Claims, 4 Drawing Sheets

DELTA-DOPED OHMIC METAL TO SEMICONDUCTOR CONTACTS

BACKGROUND OF THE INVENTION

This invention relates to ohmic contacts and, more particularly, to ohmic contacts that are fabricated in III–V semiconductor materials where III and V refer to groups in the periodic table of elements.

Ohmic contacts are contacts which exhibit a linear current versus voltage characteristic. These type contacts are an important element of all semiconductor devices, such as field-effect transistors, light-emitting diodes and lasers. Ohmic contacts eliminate the inherently strong influence of the highly resistive surface depletion region present in the current-voltage characteristic of a metal-semiconductor junction.

One of the most common ohmic contacts utilized in the prior art is formed by alloying a metal to a semiconductor surface. The metal impurities are caused to act as donors or acceptors in the semiconductor material. Recent studies of alloyed ohmic contacts on III–V semiconductor materials show that in addition to the simple diffusion a formation of domains with different chemical composition occurs thereby modifying the performance of the III–V semiconductor device. The alloying is also disruptive in that it produces irregularities in the interface between the metallic doped material and the undoped semiconductor material. These irregularities can in turn result in unpredictable behavior for the semiconductor device using these contacts.

Still another technique for establishing an ohmic contact is to diffuse a dopant material from groups II, IV or VI of the periodic table of elements into the III–V semiconductor material. The amount of dopant that may be diffused has been limited by the fact that increased amounts causes a disruption in the morphology of the semiconductor surface. In the case of silicon, for example, when used as a dopant in gallium arsenide, the silicon can be doped to provide a density of about $2 \times 10^{18} cm^{-3}$. This provides a low resistance contact but even lower resistance would be desirable.

SUMMARY OF THE INVENTION

A new type of non-alloyed ohmic contact to III–V semiconductor material is realized by using the process of molecular beam epitaxy (MBE). An ohmic characteristic is achieved at a metal-semiconductor junction by placing a delta-doped donor layer at a distance from the metal-semiconductor junction that is no greater than the tunneling width of the electrons from the junction. By fabricating a plurality of these delta-doped layers that are spaced from each other by a few lattice constants a superior ohmic contact with an extremely linear current-voltage characteristic is obtained. The surface of the III–V semiconductor material is contacted in the desired area by evaporating a metal onto the surface of the semiconductor material.

BRIEF DESCRIPTION OF THE DRAWING

The invention will be better understood after reading the following detailed description in conjunction with the drawings, wherein.

DETAILED DESCRIPTION

Figure 1:
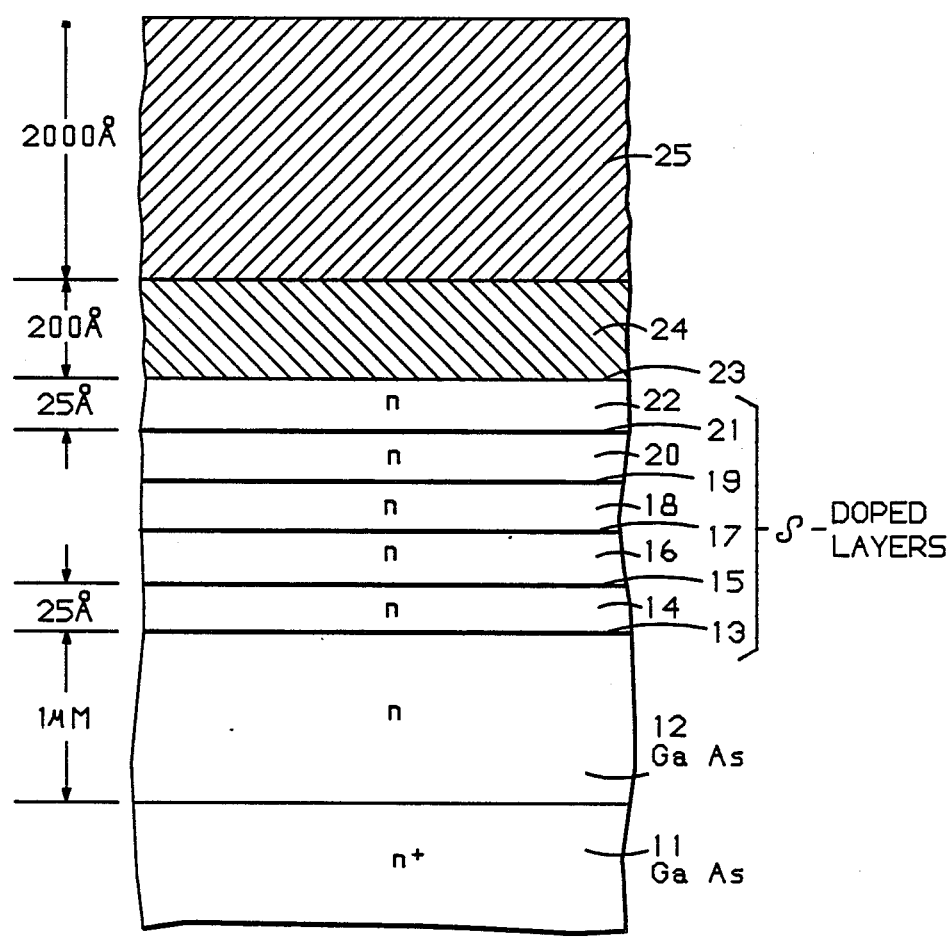
FIG. 1 is a cross-section of a III–V semiconductor material in which a superior ohmic contact has been created in accordance with the present invention.

An embodiment of the present invention wherein a superior ohmic contact has been formed on a gallium arsenide substrate is illustrated in cross-sectional form in FIG. 1. In this Figure, a heavily doped n+ type gallium arsenide substrate 11 is placed in a Vacuum Generator model V80 Molecular Beam Epitaxy (MBE) system equipped with two growth chambers interconnected by a trolley interlock stage. In this system conventional effusion cells were used for evaporation of the group III elements and for evaporation of the dopant material. In the contacts which were grown, gallium was used as the group III element and the dopant material was silicon. The group V element, arsenic, was obtained from arsene ($AsH_3$) which was cracked by heating in the MBE chamber.

After substrate 11 is placed in the MBE apparatus a doped buffer layer 12 was permitted to grow on substrate 11 to a thickness of one micrometer with a three-dimensional dopant density $N_d$ equal to about $10^{18}$ $cm^{-3}$. At this point in time, the growth of the N type gallium arsenide crystal was interrupted for 23 minutes by closing the gallium-effusion cell and permitting the crystal to be exposed only to the arsenic and silicon thereby permitting a delta-doped layer 13 to be grown on the buffer layer 12. By using the knowledge obtained from previous growths relating to the rate of silicon deposit, the number of minutes required for a predetermined density of silicon may be calculated. In the embodiment which was constructed, the crystal growth was interrupted for 23 minutes thereby achieving a silicon two-dimensional density of about $5 \times 10^{13}/cm^2$. Since the crystal normally has approximately $6 \times 10^{14}$ group III elements per square centimeter this interruption of growth essentially places a silicon atom at about one out of ten gallium sites on the crystal. The gallium-effusion cell is again opened and the crystal is permitted to grow for about 25 Å thereby creating layer 14. The process of closing the gallium-effusion cell and regrowing the normal crystal is repeated during four more intervals resulting in the delta-doped layers 15, 17, 19 and 21 and the normal N doped crystal layers 16, 18, 20 and 22, all in FIG. 1.

Layers 13, 15, 17, 19 and 21 in FIG. 1 are called delta-doped layers in the present specification, but other terms have been used in the prior art. This type of doping essentially provides an increased amount of dopant in a single atomic plane or monolayer of the crystal. Accordingly some prior art have described this doping as atomic-plane doping. See the article entitled "Complex free-carrier profile synthesis by "atomic-plane" doping of MBE GaAs" by C. E. C. Wood, G. Metze, J. Berry and L. F. Eastman, *Journal of Applied Physics*, Vol. 51, January 1980, pp. 383-387, which article is incorporated herein by reference. Also see the article entitled "Radiative electron-hole recombination in a new sawtooth semiconductor super lattice growth by molecular-beam epitaxy," by E. F. Schubert, Y. Horikoshi and K. Ploog, *Physical Review B*, Vol. 32, No. 2, July 15, 1985, pp. 1085-1089, which article is also incorporated herein by reference. The term delta-doped comes from the Dirac-delta function which is a useful way to describe the charge density in the delta-doped monolayers even though it is not, strictly speaking, accurate since the Dirac-delta function has problematic physical meaning at its center.

Figure 2:
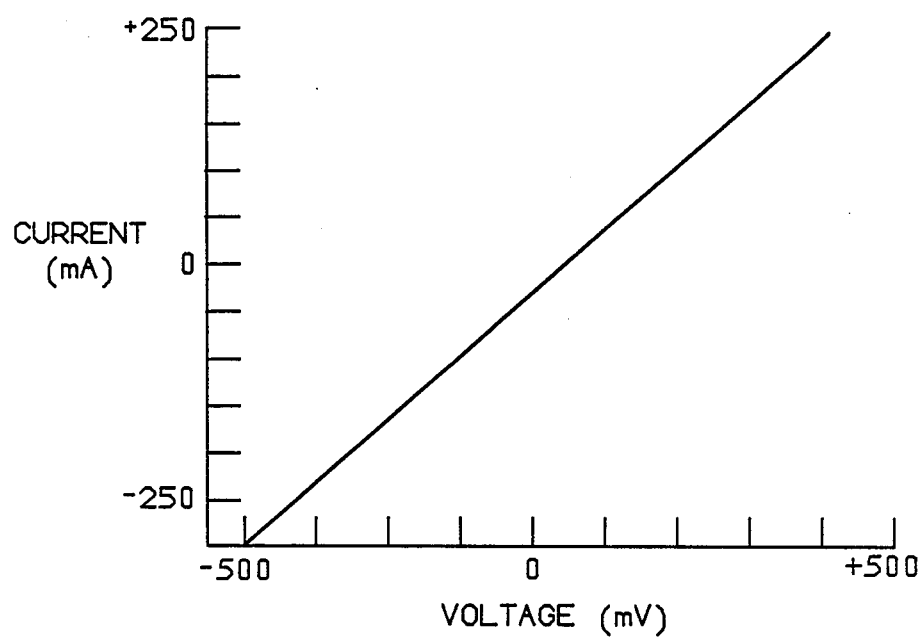
FIGS. 2 through 5 are curves and diagrams that are useful in describing the operation of the present invention.

To complete the contact, chromium is deposited on surface 23 of layer 22 to a thickness of about 200 Å in order to establish layer 24 followed by an evaporation of about 2000 Å of gold to create a layer 25. Excellent linear ohmic characteristics were achieved for a delta-doped contact having a radius of 255 micrometers. The current versus voltage characteristic of this contact is shown in FIG. 2. The total resistance of 1.4 ohms demonstrates the high potential of the present ohmic contact method. As indicated in FIG. 2, the current voltage characteristic exhibits strictly linear behavior with S- and N- shaped patterns absent on all scales.

Figure 3:
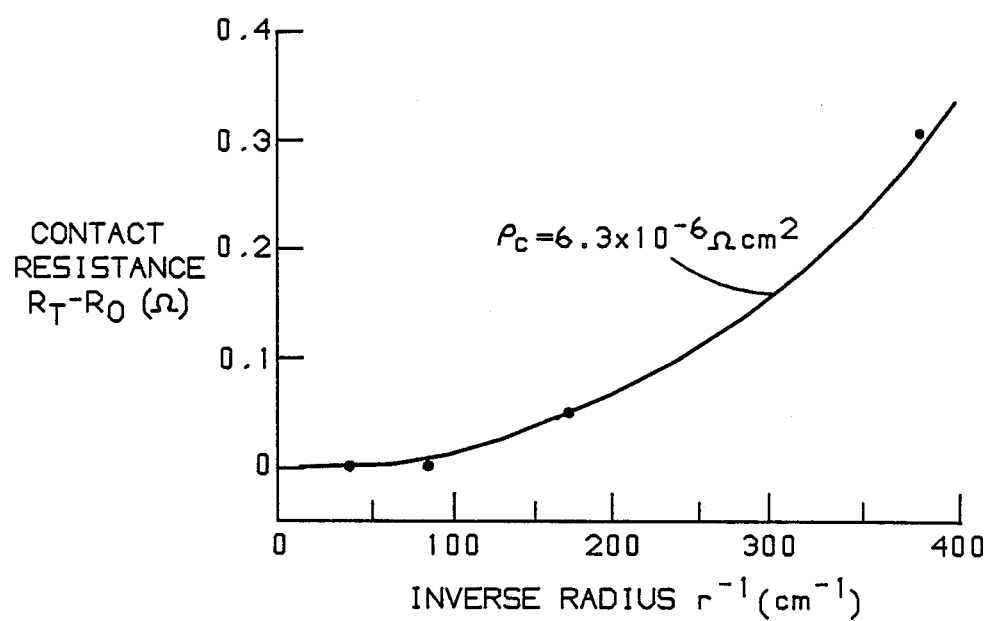

To determine a specific contact resistance, the equations developed by Cox and Strack were utilized. See the article entitled "Ohmic Contacts for GaAs Devices", by R. H. Cox and H. Strack, *Solid State Electronics*, Vol. 10, pages 1213-1218, 1967. A plot of the contact resistance $(R_r-R_o)$ versus the inverse radius size of the contact is shown in FIG. 3. To obtain the experimental points, contacts with different size radii were established and measured and compared with the theoretical curve predicted by Cox and Strack. As indicated in FIG. 3 the calculated fit to the the experimental data yields a specific contact resistance of about $6.3 \times 10^{-6}$ ohm-cm$^2$.

The surface of the ohmic contact metal remained smooth because these contacts require no alloying. The problems of balling-up in conventionally alloyed AuGe-based contacts were consequently avoided. Prior to establishing the chromium and gold metal layers on the surface a study was made of the surface morphology of the delta-doped GaAs layers using an optical microscope. No defects originating from the delta-doped layers were found.

As pointed out hereinabove, the silicon in the delta-doped layer achieved a two-dimensional doping concentration of $5 \times 10^{13}$/cm$^2$. In the crystal which was grown, which has a lattice constant of 5.6 Å, this two-dimensional doping concentration has yielded a three-dimensional silicon concentration of about $10^{21}$ cm$^{-3}$. This doping concentration is far in excess of what can be achieved through the normal crystal growth using silicon as a dopant. Accordingly a lower resistance contact has been obtained as a result.

Figure 4:
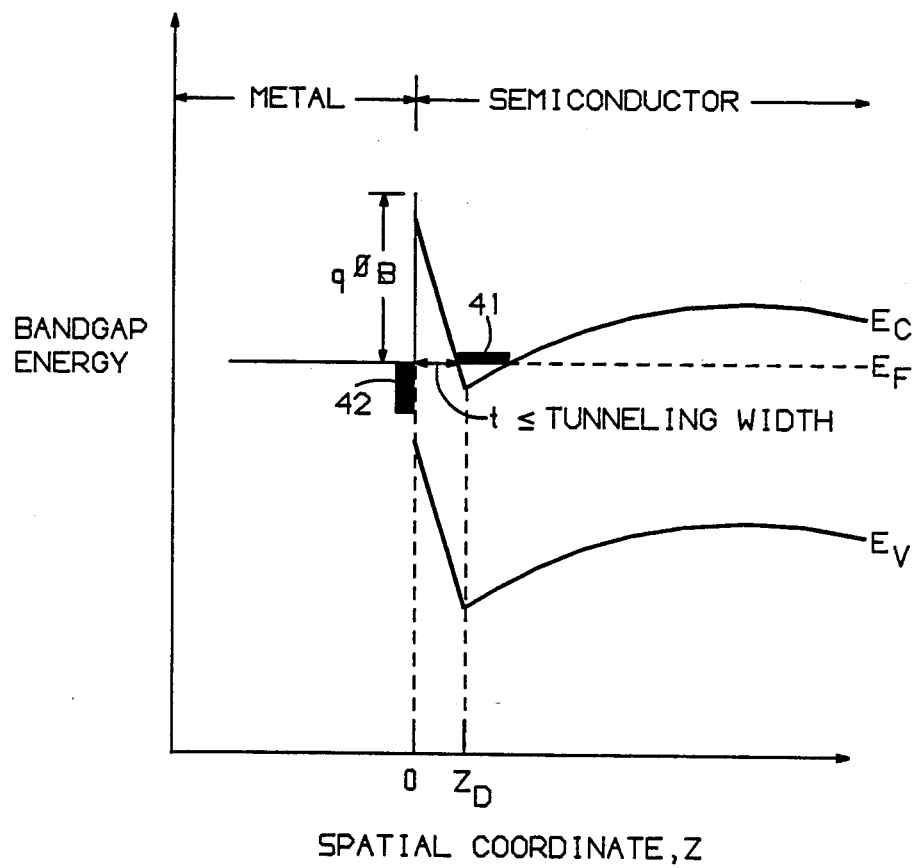

A theoretical understanding of the present invention can be achieved by studying the band gap energy diagram shown in FIG. 4. The diagram shown in FIG. 4 is for a metal to semiconductor interface where a single delta-doped layer has been fabricated at a distance of $Z_d$ from the interface. In this diagram, $E_C$ is the edge of conduction energy, $E_F$ is the Fermi energy, $E_V$ is the edge of the valence-band energy, q is the elementary charge, $\phi_B$ is the potential height of the Schottky barrier at the metal semiconductor interface, $q\phi_B$ is the energy height of the Schottky barrier at the metal semiconductor interface, and $Z_D$ is the distance from the interface to the delta-doped atomic layer. This diagram is similar to the one shown in FIG. 1 of the article entitled "The Delta-Doped Field Effect Transistor" by E. F. Schubert et al., *Japanese Journal of Applied Physics*, Vol. 24, No. 8, August 1985, pp. L608-L610. The difference which creates the present invention is that the delta-doped monolayer is placed at a distance $Z_D$ from the metal to semiconductor interface such that the tunneling barrier t is thin, and consequently quantum-mechanical tunneling through the barrier provides the dominant transport mechanism. As shown in FIG. 4 the delta-doped monolayer creates a reservoir of electrons 41 at a distance t from the metal to semiconductor interface. A major fraction of these electrons which originate from donors of the delta-doped layer occupy surface states at the metal-semiconductor interface, as illustrated in FIG. 4 by the numeral 42.

Figure 5:
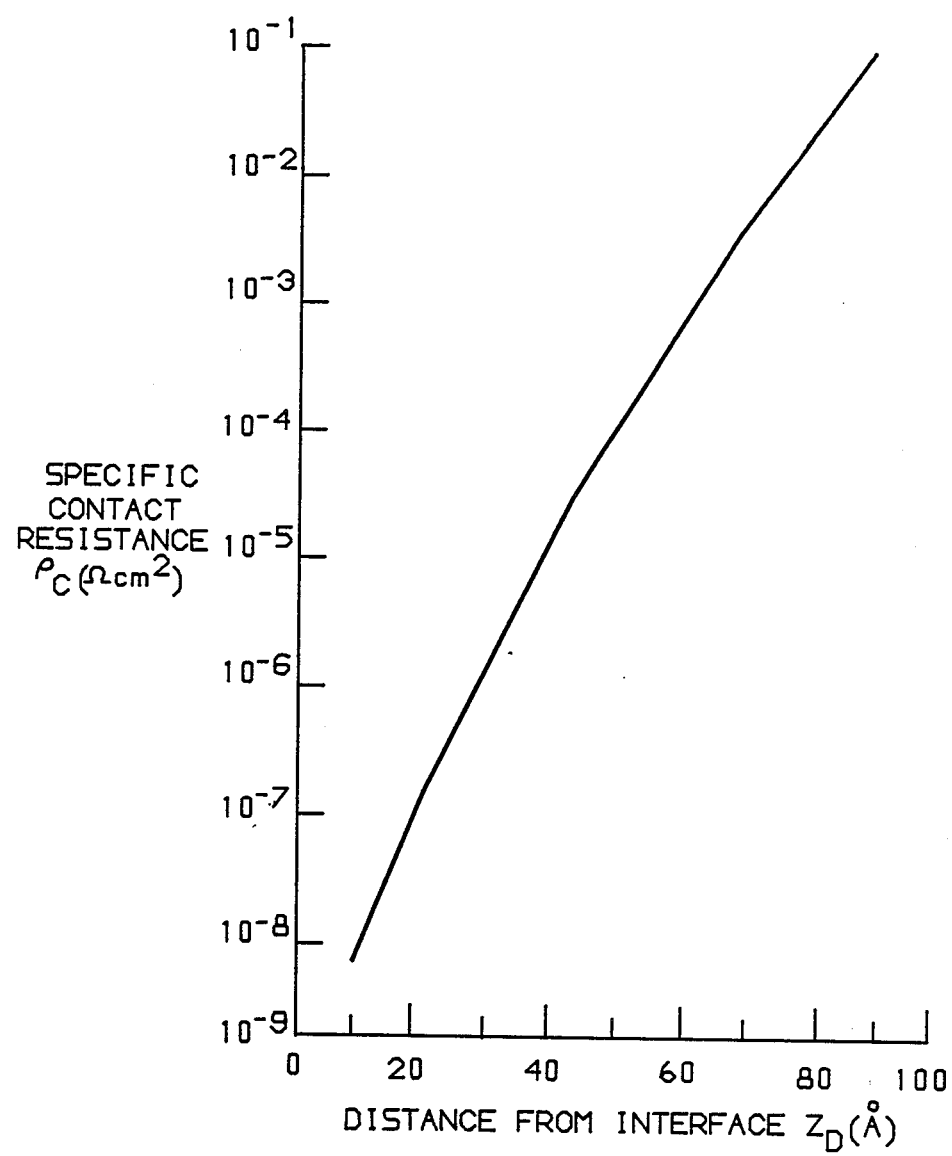

A theoretical analysis of a single monolayer can be conducted to obtain an expression for the specific contact resistance versus distance from the interface $Z_d$. This expression has been plotted in FIG. 5 and shown as curve 51. As indicated in FIG. 5 a distance from the interface of 25 Å theoretically yields a specific contact resistance of $10^{-7}$ ohm-cm$^2$. This compares favorably with the measured specific contact resistance illustrated in FIG. 3 where a specific contact resistance of $6.3 \times 10^{-6}$ ohm-cm$^2$ was obtained. As also indicated in FIG. 5, further development work may yield contact resistances in the range of $10^{-7}$ to $10^{-9}$ ohm-cm$^2$. As shown in FIG. 5 the contact resistance is low as long as the distance from the interface for the delta-doped monolayer is on the order of the lattice constant. As in the present embodiment a plurality of delta-doped layers may be utilized in order to insure low contact resistance.

Numerous departures from the present embodiment may be made without departing from the spirit and scope of the present invention. For example, elements from group IV in the periodic table of elements, such as, germanium and tin, may also be utilized in order to produce n-type gallium arsenide. Similarly, elements from group VI, for example, sulfur, selenium, and tellurium, may also be utilized in order to produce n-type gallium arsenide. To produce P-type delta-doped monolayers, elements from group II, for example, beryllium and magnesium, as well as manganese and zinc, may be used.

What is claimed is:

1. An ohmic contact in a semiconductor device, comprising a layer of doped III-V semiconductor material and a metal layer deposited over the surface of said doped layer, characterized in that
    at least one delta doped monolayer and at least one thin layer of order 25 Angstroms or less in thickness of said III-V semiconductor material are interposed between the doped layer and the metal layer, with the delta-doped monolayer interfacing with the said surface of the doped layer and the thin interfacing with the metal layer, the thickness of the thin layer being equal to or less than the tunneling width of electrons in the III-V semiconductor material, and
    at least said doped layer, said at least one delta doped monolayer and said at least one thin layer are layers grown by Molecular Beam Epitaxy.

2. An ohmic contact as defined in claim 1 wherein a plurality of delta-doped monolayers and a matching plurality of thin layers are arranged in an alternating sequence between the said surface of the doped layer and the metal layer, with a lowermost of the said plurality of delta-doped monolayers forming the said interface with the said surface and an uppermost of the said plurality of thin layers forming the said interface with the metallic layer.

3. An ohmic contact as defined in claim 1 wherein said at least one delta-doped monolayer uses a dopant chosen from the group consisting of manganese, beryllium, and zinc, or an element from groups II, IV and VI of the periodic table of elements.

4. An ohmic contact as defined in claim 1 wherein the III-V semiconductor material is GaAs and the dopant is silicon.

5. An ohmic contact as defined in claim 1 wherein said doped layer is a buffer layer of III-V semiconductor material grown on a substrate of III-V semiconductor material.

6. An ohmic contact as defined in claim 5 wherein said buffer layer is GaAs.

* * * * *